(12) United States Patent
Liang (10) Patent No.: US 11,575,045 B2
(45) Date of Patent: Feb. 7, 2023

(54) SEMICONDUCTOR DEVICE AND MANUFACTURING METHOD THEREOF

(71) Applicant: Powerchip Semiconductor Manufacturing Corporation, Hsinchu (TW)

(72) Inventor: Yi-Chung Liang, Tainan (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 0 days.

(21) Appl. No.: 17/705,407

(22) Filed: Mar. 28, 2022

(65) Prior Publication Data

US 2022/0216337 A1    Jul. 7, 2022

Related U.S. Application Data

(62) Division of application No. 17/147,476, filed on Jan. 13, 2021, now Pat. No. 11,335,808.

(30) Foreign Application Priority Data

Dec. 7, 2020 (TW) ................. 109143094

(51) Int. Cl.
*H01L 21/02* (2006.01)
*H01L 29/78* (2006.01)
*H01L 29/08* (2006.01)
*H01L 29/66* (2006.01)
*H01L 29/165* (2006.01)

(52) U.S. Cl.
CPC .... *H01L 29/7848* (2013.01); *H01L 21/02532* (2013.01); *H01L 21/02639* (2013.01); *H01L 29/0847* (2013.01); *H01L 29/165* (2013.01); *H01L 29/66636* (2013.01)

(58) Field of Classification Search
None
See application file for complete search history.

(56) References Cited

U.S. PATENT DOCUMENTS

2022/0216337 A1* 7/2022 Liang ................. H01L 29/7848

\* cited by examiner

*Primary Examiner* — Jack S Chen
(74) *Attorney, Agent, or Firm* — JCIPRNET (57) ABSTRACT

A manufacturing method of a semiconductor device at least includes the following steps. A substrate having a stacked structure is provided. An epitaxy process is performed to form an epitaxial layer on the substrate on two sides of the stacked structure. A recess is forming on the two sides of the stacked structure, wherein the recess penetrates through the epitaxial layer, extends into the substrate, and has a tip located in the substrate. A source/drain region is formed in the recess, wherein a material of the source/drain region comprises silicon germanium. A spacer wall material layer is formed on the substrate. A portion of the stacked structure is removed to from a gate structure. A portion of the spacer wall material layer is removed to form a spacer wall on the epitaxial layer. A semiconductor device is also provided.

10 Claims, 8 Drawing Sheets

SEMICONDUCTOR DEVICE AND MANUFACTURING METHOD THEREOF

CROSS-REFERENCE TO RELATED APPLICATION

This application is a divisional application of U.S. application Ser. No. 17/147,476 filed on Jan. 13, 2021, now allowed, which claims the priority benefit of Taiwanese application serial no. 109143094, filed on Dec. 7, 2020. The entirety of each of the above-mentioned patent applications is hereby incorporated by reference herein and made a part of this specification.

BACKGROUND

Technical Field

The disclosure relates to a device and a manufacturing method thereof, and in particular, relates to a semiconductor device and a manufacturing method thereof.

Description of Related Art

At present, the embedded silicon germanium (embedded SiGe, eSiGe) process is deployed most of the time to form the source/drain region in a semiconductor device because in this way, compressive stress in the channel region may be raised, hole mobility may be increased, and the operating speed may be improved. Nevertheless, continuous technology advancement has led to increasing demand for enhanced performance of semiconductor devices. Therefore, how to further improve the structure of the source region or the drain region (embedded silicon germanium) of a semiconductor device to achieve performance enhancement is an important issue.

SUMMARY

The disclosure provides semiconductor device and a manufacturing method thereof capable of providing enhanced performance.

The disclosure provides a semiconductor device including a substrate, a gate structure, a source/drain region, an epitaxial layer, and a spacer wall. The substrate has an upper surface. The gate structure is arranged on the upper surface. The source/drain region is arranged on two sides of the gate structure, is partially embedded in the substrate, and has a tip located in the substrate. A material of the source/drain region includes silicon germanium. The epitaxial layer is arranged between the gate structure and the source/drain region. The spacer wall is arranged on the epitaxial layer on the two sides of the gate structure.

In an embodiment of the disclosure, a cross-sectional shape of the source/drain region includes a diamond shape.

In an embodiment of the disclosure, the gate structure includes a gate dielectric layer, and the gate dielectric layer is located below the spacer wall.

In an embodiment of the disclosure, a thickness of the epitaxial layer is greater than a thickness of the gate dielectric layer.

In an embodiment of the disclosure, the spacer wall directly contacts the epitaxial layer.

In an embodiment of the disclosure, the source/drain region, the gate structure, and the spacer wall surround the epitaxial layer.

In an embodiment of the disclosure, a first portion of a side wall of the gate structure is covered by the epitaxial layer, a second portion of the side wall of the gate structure is covered by the spacer wall, and the first portion is located between the upper surface and the second portion.

In an embodiment of the disclosure, a top surface of the source/drain region is higher than the upper surface.

In an embodiment of the disclosure, the source/drain region penetrates through the epitaxial layer.

In an embodiment of the disclosure, the semiconductor device further includes an isolation structure. The isolation structure is arranged in the substrate. The source/drain region adjacent to the isolation structure and directly contacting the isolation structure has a facet, and a top end of the facet and a top surface of the epitaxial layer are located on a same level.

The disclosure further provides a manufacturing method of a semiconductor device including the following steps. A substrate having a stacked structure is provided. An epitaxy process is performed to form an epitaxial layer on the substrate on two sides of the stacked structure. A recess is formed on the two sides of the stacked structure. The recess penetrates through the epitaxial layer, extends into the substrate, and has a tip located in the substrate. A source/drain region is formed in the recess. A material of the source/drain region includes silicon germanium. A spacer wall material layer is formed on the substrate. A portion of the stacked structure is removed to from a gate structure. A portion of the spacer wall material layer is removed to form a spacer wall on the epitaxial layer.

In an embodiment of the disclosure, the stacked structure includes a hard mask layer, and the step of forming the recess further includes the following steps. A sacrificial side wall material layer is formed on the epitaxial layer on the two sides of the stacked structure. An etching process is performed on the hard mask layer and the sacrificial side wall material layer to remove a portion of the epitaxial layer and a portion of the substrate.

In an embodiment of the disclosure, the sacrificial side wall material layer is a single-layered structure.

In an embodiment of the disclosure, an etchant of the etching process etches in a direction of the epitaxial layer and a crystal plane (111) of the substrate.

In an embodiment of the disclosure, a side wall of the recess is directly connected to a side wall of the sacrificial side wall material layer.

In an embodiment of the disclosure, the sacrificial side wall material layer is removed after the source/drain region is formed and before the spacer wall material layer is formed to expose the epitaxial layer.

In an embodiment of the disclosure, the substrate includes an isolation structure, and the epitaxial layer is not formed on the isolation structure when the epitaxy process is performed.

In an embodiment of the disclosure, the isolation structure is exposed by the adjacent recess.

In an embodiment of the disclosure, the substrate is a silicon substrate to perform a selective silicon growth epitaxy process to form the epitaxial layer.

In an embodiment of the disclosure, a cross-sectional shape of the recess includes a diamond shape.

To sum up, the embedded silicon germanium having the tip acts as the source/drain region in the disclosure. Further, the epitaxial layer is introduced between the upper surface of the substrate and the spacer wall, and through the introduction of the epitaxial layer, the overall height is increased when the source/drain region is manufactured. In such a design, the distance between the tip of the source/drain region and the channel region may be effectively decreased, stress application performed by the source/drain region may be improved, hole mobility may be increased, and performance of the semiconductor device may further be enhanced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Directional terminology (e.g., top, down, right, left, front, rear, top, and bottom) is used with reference to the orientation of the figure(s) being described. As such, the directional terminology is used for purposes of illustration and is in no way limiting.

Unless otherwise clearly indicated, any method provided in this disclosure should not be construed as requiring steps therein to be performed in a particular order.

The disclosure is more comprehensively described with reference to the figures of the present embodiments. However, the disclosure can also be implemented in various different forms, and is not limited to the embodiments in the present specification. Thicknesses, dimensions, and sizes of layers or regions in the drawings are exaggerated for clarity. The same reference numbers are used in the drawings and the description to indicate the same or like parts, which are not repeated in the following embodiments.

FIG. 1A to FIG. 1H each is a partial cross-sectional schematic view of a part of a manufacturing method of a semiconductor device according to an embodiment of the disclosure. In this embodiment, a semiconductor device 100 is a positive channel metal oxide semiconductor (PMOS) device, and a manufacturing method thereof may include the following steps.

Figure 1A:
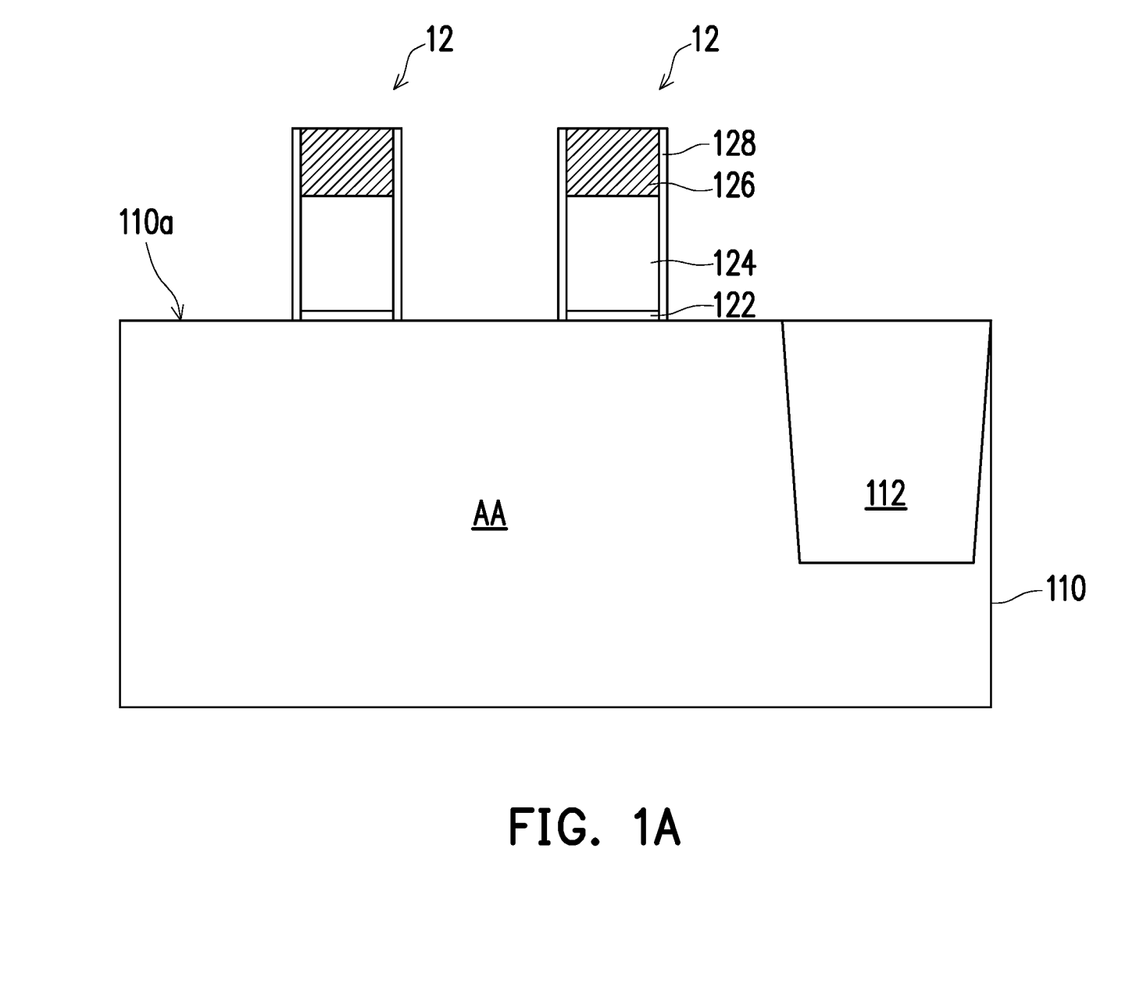
FIG. 1A to FIG. 1H each is a partial cross-sectional schematic view of a part of a manufacturing method of a semiconductor device according to an embodiment of the disclosure.

With reference to FIG. 1A, a substrate 110 having stacked structures 12 is provided. Note that in FIG. 1A, a number of the stacked structures 12 is only for exemplary illustration (two stacked structures 12 are schematically shown), and the number of the stacked structures 12 is not particularly limited in the disclosure and may be determined according to actual design needs.

Further, the substrate 110 has an upper surface 110a. In some embodiments, the substrate 110 is a silicon substrate, and the upper surface 110a is a crystal plane (100) of the substrate 110. In other words, the upper surface 110a may be a plane substantially extending in a horizontal direction, which should however not be construed as limitations to the disclosure. The substrate 110 may be any semiconductor material suitable for a subsequent epitaxy process.

In some embodiments, each of the stacked structures 12 is a structure having a plurality layers arranged on the substrate 110. For instance, the stacked structure 12 includes a gate dielectric layer 122, a conductor layer 124, a hard mask layer 126, and an insulating layer 128 covering side walls of the dielectric layer 122, the conductor layer 124, and the hard mask layer 126 sequentially stacked on the substrate 110. Further, as the gate dielectric layer 122 and the insulating layer 128 respectively cover a bottom surface and the side wall of the conductor layer 124, a favorable electrical isolation effect is provided between the conductor layer 124 and other subsequently-formed conductive elements, which should however not be construed as limitations to the disclosure.

In addition, the hard mask layer 126 may be selectively arranged according to actual process needs. For instance, the hard mask layer 126 may be arranged to act as an etching mask when an etching process is subsequently implemented to form a recess R. In other words, the hard mask layer 126 may be omitted if the etching process is not subsequently implemented to form the recess R.

In some embodiments, a material of the gate dielectric layer 122 includes silicon oxide. A material of the conductor layer 124 includes doped polysilicon, undoped polysilicon, or a combination thereof. A material of the hard mask layer 126 may include silicon dioxide, silicon nitride, silicon oxynitride, or a combination thereof. A material of the insulating layer 128 includes silicon oxide or silicon nitride, and the gate dielectric layer 122, the conductor layer 124, the hard mask layer 126, and the insulating layer 128 may be manufactured through a deposition process, which should however not be construed as limitations to the disclosure.

Besides, in an embodiment that is not shown, the insulating layer 128 may be a composite layer formed by oxide/nitride/oxide (ONO) layers, such as a composite layer formed by silicon oxide/silicon nitride/silicon oxide.

In some embodiments, the semiconductor device 100 further includes an isolation structure 112 arranged in the substrate 110, and the isolation structure 112 distinguishes itself from an active region AA in the substrate 110. The isolation structure 112 is, for example, a shallow trench isolation (STI) structure, which should however not be construed as limitations to the disclosure.

Figure 1B:
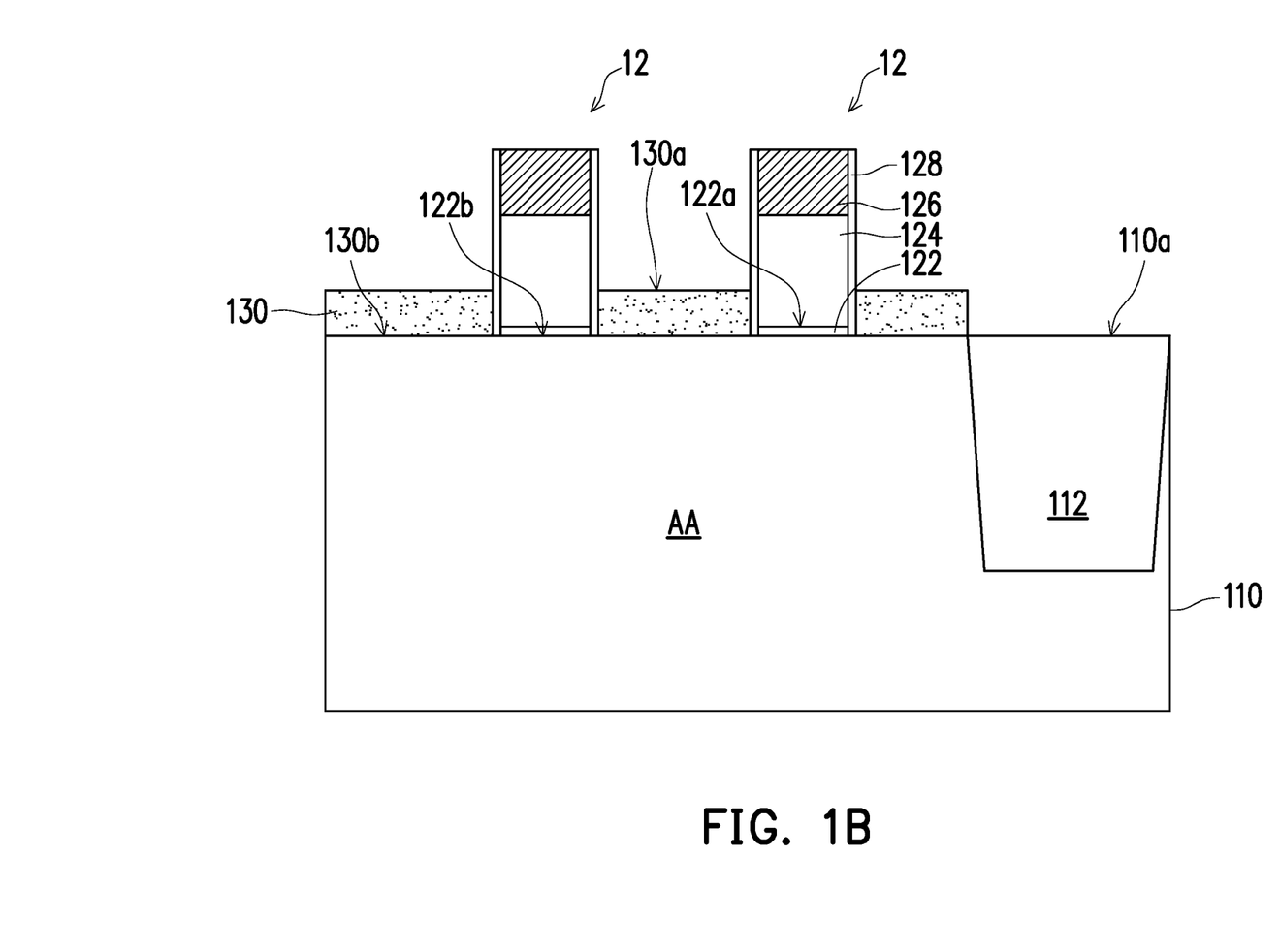

With reference to FIG. 1B, an epitaxy process is performed to form an epitaxial layer 130 on the substrate 110 on two sides of each of the stacked structures 12, such that an overall height may be increased when a source/drain region 150 is subsequently manufactured through the epitaxial layer 130. In some embodiments, the substrate 110 is a silicon substrate to perform a selective silicon growth epitaxy process to form the epitaxial layer 130. In this way, the epitaxial layer 130 is a silicon epitaxial layer formed on the upper surface 110a of the substrate 110 only, which should however not be construed as limitations to the disclosure.

In some embodiments, a thickness of the epitaxial layer 130 is greater than a thickness of the gate dielectric layer 122. In other words, a top surface 130a of the epitaxial layer 130 is higher than a top surface 122a of the gate dielectric layer 122, such that the epitaxial layer 130 covers the insulating layer 128 on two sides of the conductor layer 124, which should however not be construed as limitations to the disclosure.

In some embodiments, a bottom surface 122b of the gate dielectric layer 122, a bottom surface 130b of the epitaxial layer 130, and the upper surface 110a of the substrate 110 are substantially coplanar. In other words, the gate dielectric layer 122 and the epitaxial layer 130 directly contact the substrate 110, which should however not be construed as limitations to the disclosure.

In some embodiments, since a material of the isolation structure 112 and the material of the substrate 110 are different, the epitaxial layer 130 is not formed on the isolation structure 112 when the epitaxy process is performed. In other words, an orthogonal projection of the epitaxial layer 130 on the substrate 110 does not overlap with the isolation structure 112, which should however not be construed as limitations to the disclosure.

Figure 1C:
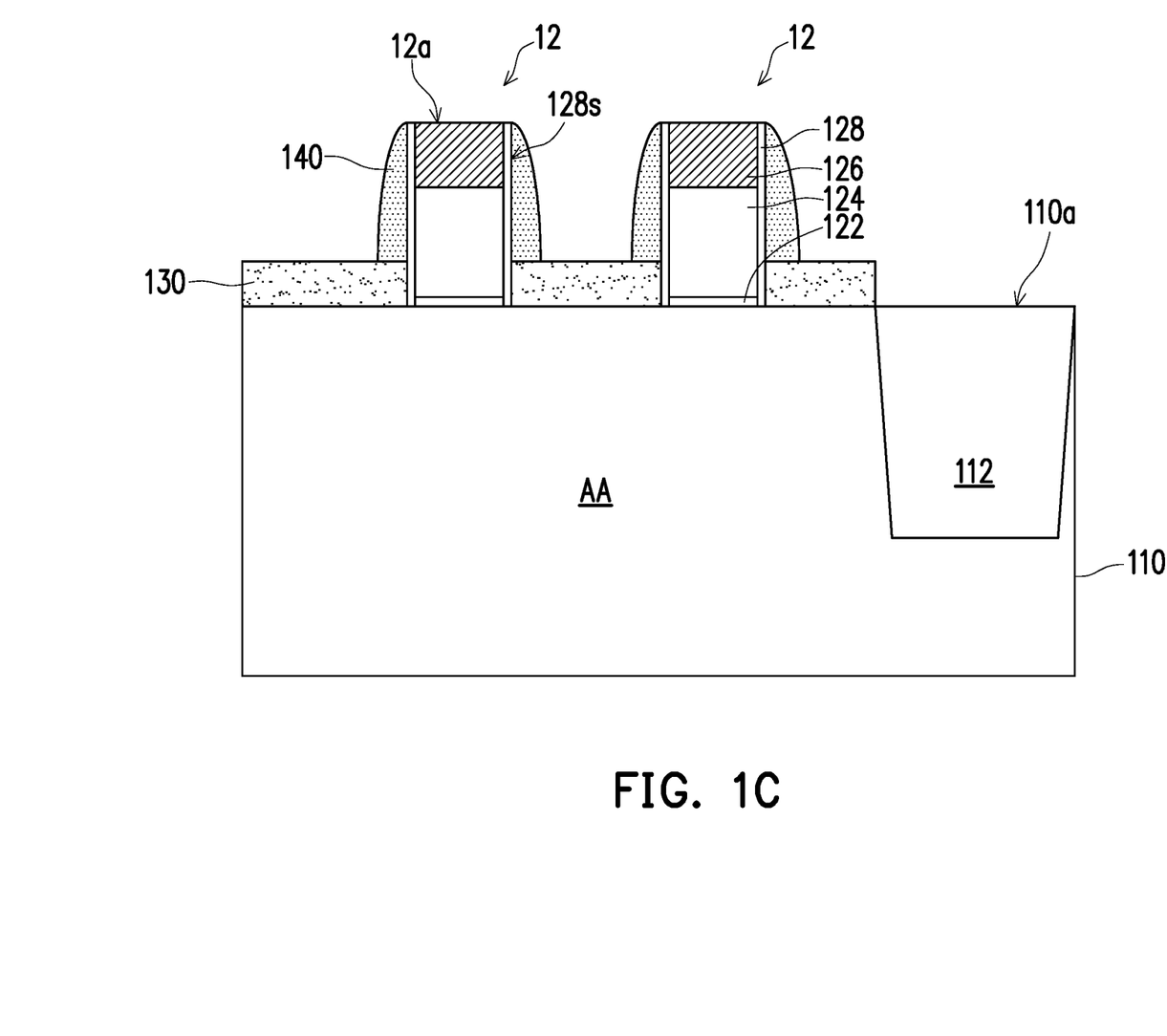

With reference to FIG. 1C, after the epitaxial layer 130 is formed, a sacrificial side wall material layer 140 may be selectively formed on the epitaxial layer 130 on the two sides of each of the stacked structures 12. Further, since the overall height is increased when the source/drain region 150 is subsequently manufactured through the epitaxial layer 130, the introduction of the epitaxial layer 130 may decrease a layer number of the sacrificial side wall material layer 140 to be used and may reduce a number of the etching process, and manufacturing costs are thereby lowered. For instance, the sacrificial side wall material layer 140 is a single-layered structure. In other word, since only one layer of the sacrificial side wall material layer 140 rather than two or more layers of the sacrificial side wall material layer 140 is used, the layer number of the sacrificial side wall material layer 140 to be used may be decreased, the number of the etching process may be reduced, so that the manufacturing costs may be further lowered, which should however not be construed as limitations to the disclosure.

In some embodiments, the sacrificial side wall material layer 140 is nitride (e.g., silicon nitride) formed through a suitable method, which should however not be construed as limitations to the disclosure.

In some embodiments, the epitaxial layer 130 covers a portion of a side wall 128s of the insulating layer 128, and the sacrificial side wall material layer 140 covers the other portion of the side wall 128s of the insulating layer 128, which should however not be construed as limitations to the disclosure.

In some embodiments, the sacrificial side wall material layer 140 extends from a top surface 12a of each of the stacked structures 12 along the side wall 128s of the insulating layer 128 towards the substrate 110 until the sacrificial side wall material layer 140 directly contacts the epitaxial layer 130. On the other hand, the sacrificial side wall material layer 140 merely covers a portion of the epitaxial layer 130 and exposes another portion of the epitaxial layer 130 to be etched, which should not be construed as limitations to the disclosure.

Figure 1D:
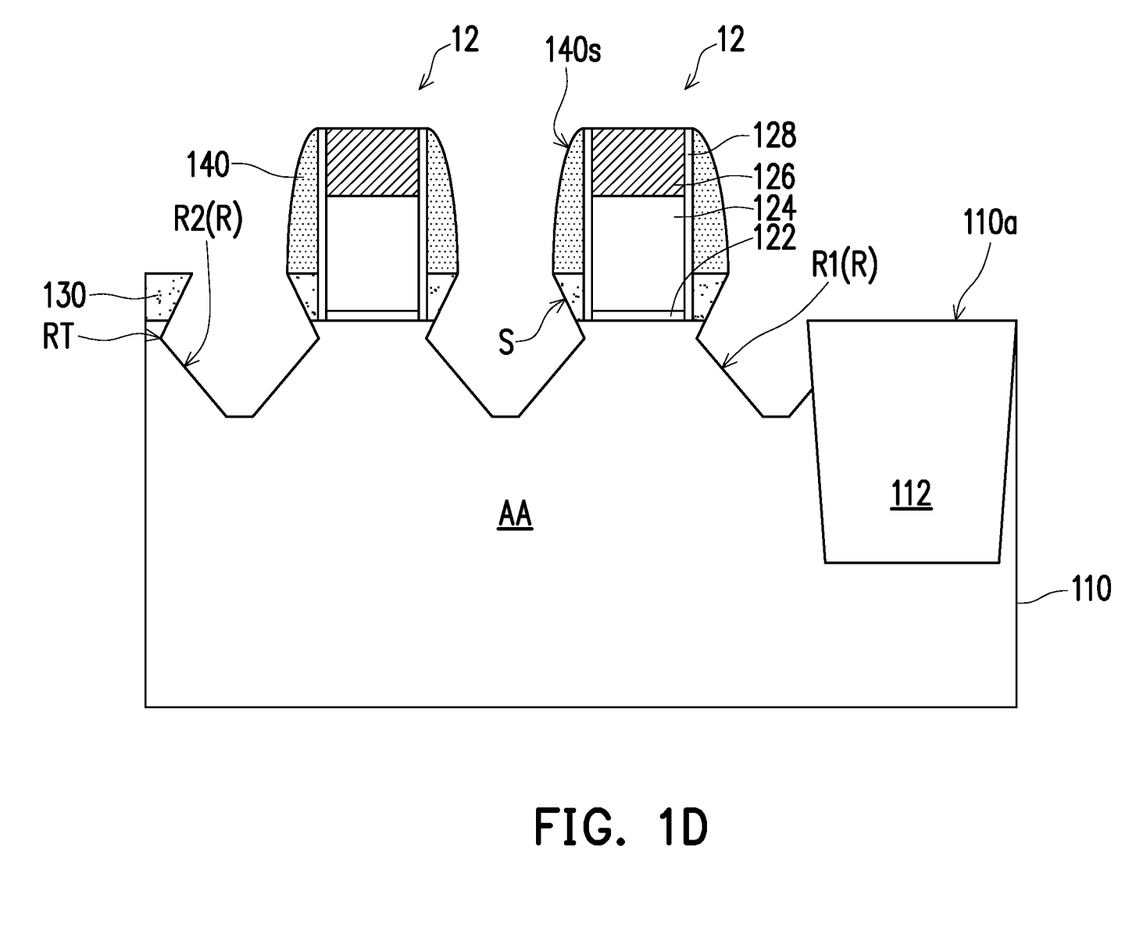

With reference to FIG. 1D, the recess R is formed on the two sides of each of the stacked structures 12. The recess R penetrates through the epitaxial layer 130, extends into the substrate 110, and has a tip RT located in the substrate 110, so as to be used for forming the source/drain (S/D) region 150 having a tip 150T subsequently. As such, a profile of the recess R may correspond to a profile of the subsequently-formed S/D region 150.

In some embodiments, the recess R is formed through an etching process performed on the hard mask layer 126 and the sacrificial side wall material layer 140 to remove a portion of the epitaxial layer 130 and a portion of the substrate 110, which should not be construed as limitations to the disclosure. In addition, parameters of the etching process may be adjusted to form a recess R having a cross-sectional shape including a diamond shape (or called as a sigma shape). The tip RT may be a diamond-shaped (or call as a sigma-shaped) tip portion, which should not be construed as limitations to the disclosure. The recess R may be shaped as other suitable shapes having tips. Note that the abovementioned diamond shape (or called as the sigma shape) may be a cross-sectional shape known to a person of ordinary skill in the art, and description thereof is not provided herein.

In some embodiments, an etchant of the etching process etches in a direction of the epitaxial layer 130 and a crystal plane (111) of the substrate 110. In this way, the recess R may form a continuous inclined slop on the epitaxial layer 130 and the substrate 110. In other words, an angle is included between the abovementioned continuous inclined slope and the upper surface 110a, which should not be construed as limitations to the disclosure.

In some embodiments, the recess R includes a recess R1 adjacent to the isolation structure 112 and a recess R2 not adjacent to the isolation structure 112. The isolation structure 112 is exposed by the adjacent recess R1. Besides, the materials of the isolation structure 112 and the substrate 110 are different. As such, a cross-sectional shape of the recess R1 adjacent to the isolation structure 112 is different from a cross-sectional shape of the recess R2 not adjacent to the isolation structure 112 as shown in FIG. 1D, which should not be construed as limitations to the disclosure.

In some embodiments, a side wall S of the recess R is directly connected to a side wall 140s of the sacrificial side wall material layer 140. In other words, the side wall 140s of the sacrificial side wall material layer 140 extends to the side wall S of the recess R, which should not be construed as limitations to the disclosure.

In some embodiments, after the recess R is formed, the epitaxial layer 130 is located between the sacrificial side wall material layer 140 and the substrate 110 and is defined to be below the sacrificial side wall material layer 140, which should however not be construed as limitations to the disclosure.

Figure 1E:
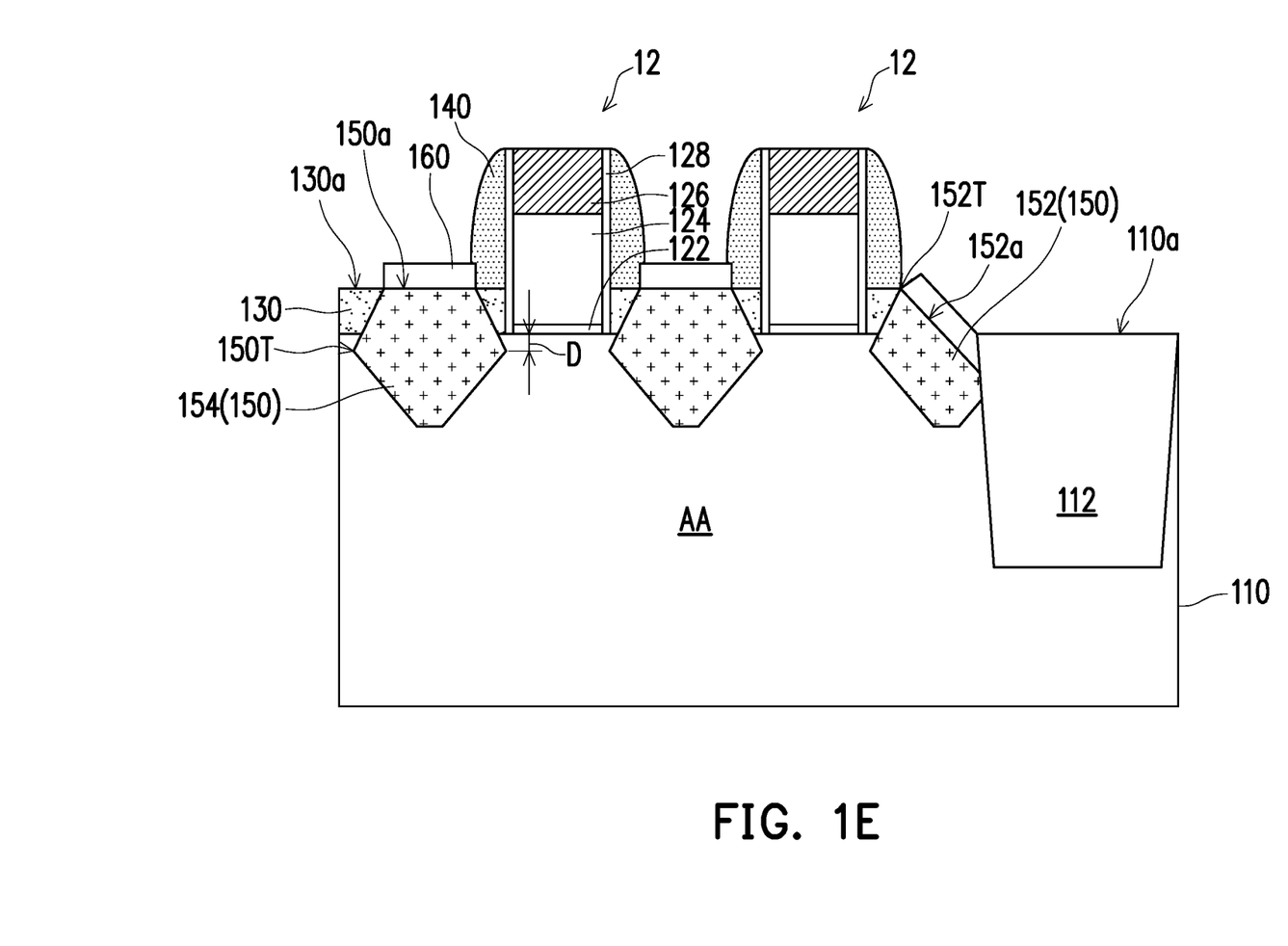

With reference to FIG. 1E, the S/D region 150 is formed in the recess R, such that the S/D region 150 is partially embedded in the substrate 110 and has the tip 150T. A material of the S/D region 150 includes silicon germanium. As such, embedded silicon germanium having the tip 150T may act as the S/D region 150 in this embodiment.

Further, a depth D of the tip 150T relative to the upper surface 110a of the substrate 110 may affect stress application performed by the S/D region 150 (embedded silicon germanium), performance of the semiconductor device 100 may thus be affected. Therefore, in this embodiment, the overall height may be increased when the S/D region 150 is manufactured through the epitaxial layer 130. In such a design, a distance between the tip 150T of the S/D region 150 and a channel region (not shown) may be effectively decreased, stress application performed by the S/D region 150 may be improved, hole mobility may be increased, and performance of the semiconductor device 100 may further be enhanced. For instance, when the depth D of the tip 150T relative to the upper surface 110a of the substrate 110 is at least less than 20 nanometers, the S/D region 150 (embedded silicon germanium) may provide a favorable stress application effect, such that the semiconductor device 100 may exhibit good performance, which should however not be construed as limitations to the disclosure.

In some embodiments, a thickness of the epitaxial layer 130 may affect the distance between the tip 150T and the channel region. For instance, if the thickness of the epitaxial layer 130 is between 20 nanometers and 25 nanometers, a favorable stress application effect is provided, such that the semiconductor device 100 may exhibit good performance, which should however not be construed as limitations to the disclosure.

In some embodiments, the S/D region 150 includes a S/D region 152 formed in the recess R1 and a S/D region 154 formed in the recess R2. The S/D region 152 adjacent to the isolation structure 112 and directly contacting the isolation structure 112 has a facet 152a, and a top end 152T of the facet 152a and the top surface 130a of the epitaxial layer 130 are located on a same level. Further, through arrangement of the epitaxial layer 130, a profile of the facet 152a on the S/D region 150 may be changed, such that contact resistance of a conductive member (e.g., a contact window, not shown) subsequently formed on the S/D region 150 may be reduced, which should however not be construed as limitations to the disclosure.

In some embodiments, the recess R is filled with silicon germanium through the epitaxy process, such that a top surface 150a of the S/D region 150 and the top surface 130a of the epitaxial layer 130 are substantially coplanar, which should however not be construed as limitations to the disclosure.

In some embodiments, the top surface 150a of the S/D region 150 is higher than the upper surface 110a. In other words, the top surface 150a of the S/D region 150 is lifted to be above the upper surface 110a, which should however not be construed as limitations to the disclosure.

In some embodiments, the S/D region 150 penetrates through the epitaxial layer 130, which should however not be construed as limitations to the disclosure.

In addition, the semiconductor device 100 may further includes a cover layer 160. A material of the cover layer 160 may be, for example, silicon, which should however not be construed as limitations to the disclosure. In an embodiment that is not shown, the semiconductor device 100 may not include the cover layer 160 depending on actual design needs.

Figure 1F:
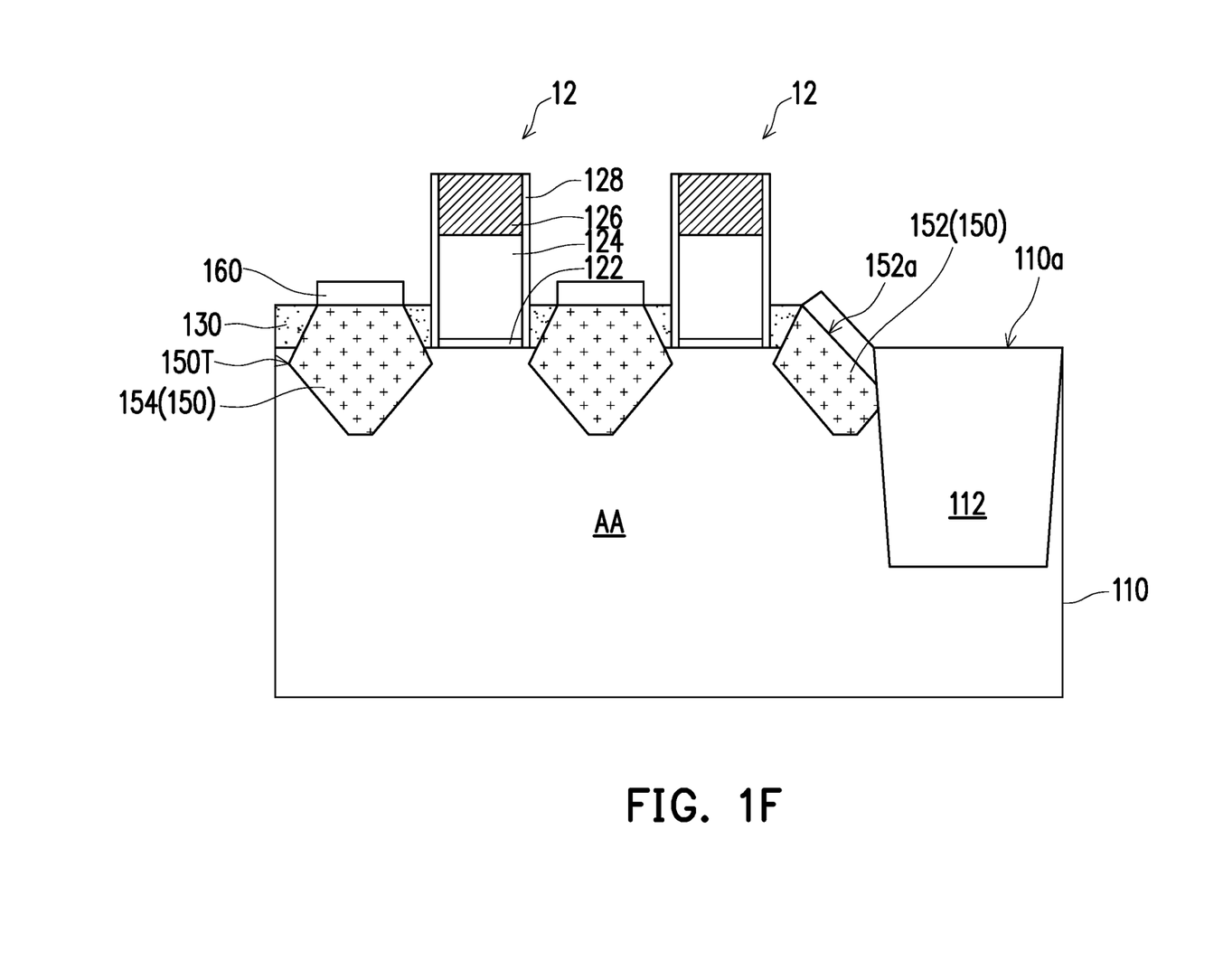

With reference to FIG. 1F, after the cover layer 160 is formed, the sacrificial side wall material layer 140 may be removed to expose the epitaxial layer 130. Further, the sacrificial side wall material layer 140 is removed through, for example, the etching process, which should however not be construed as limitations to the disclosure.

Figure 1G:
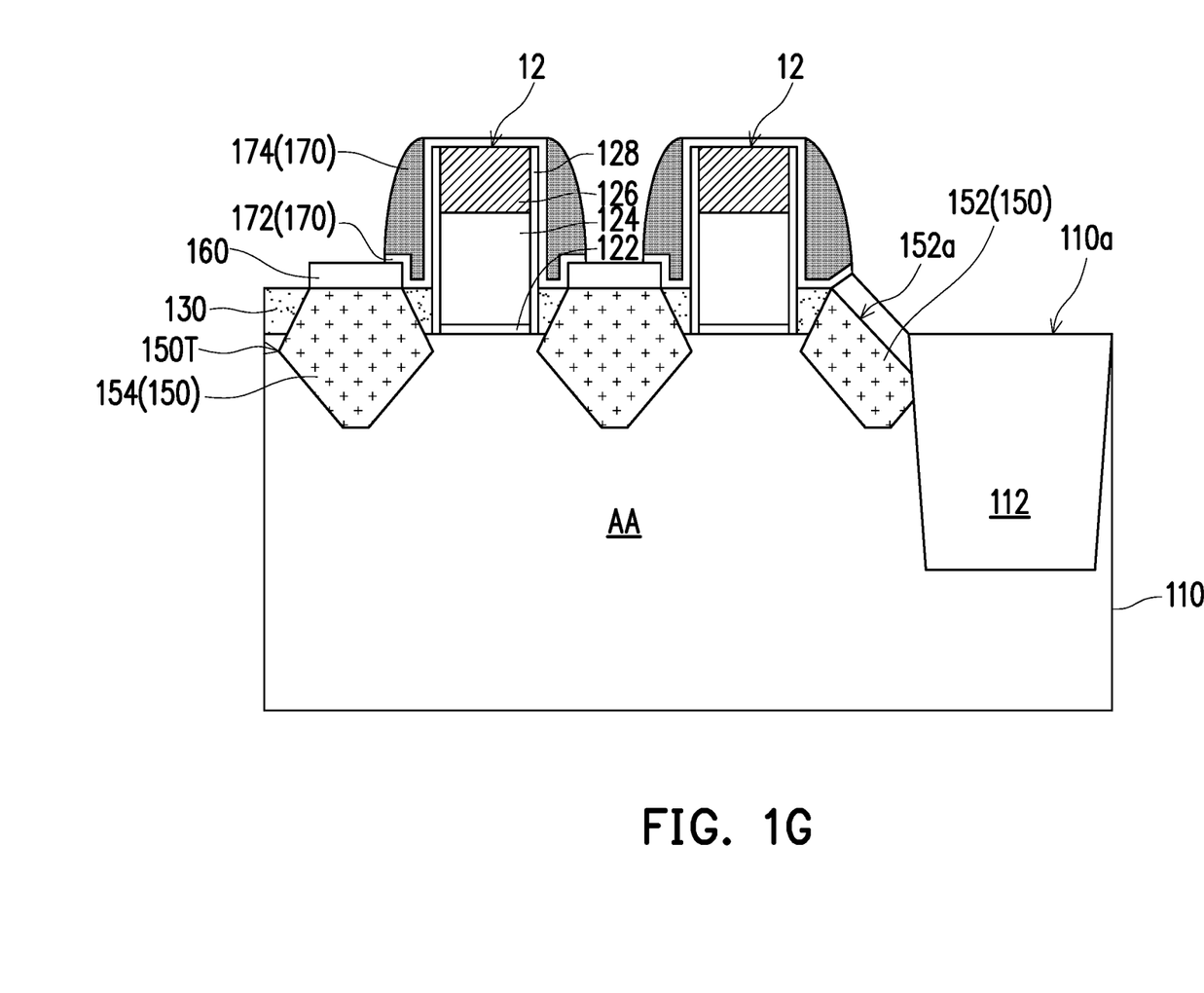

With reference to FIG. 1G, a spacer wall material layer 170 is formed on the substrate 110. The spacer wall material layer 170 may include a spacer wall material layer 172 and a spacer wall material layer 174. The spacer wall material layer 172 may act as a buffer layer, which should however not be construed as limitations to the disclosure. In an embodiment that is not shown, the spacer wall material layer 172 may selectively not to be formed.

In some embodiments, a buffer material (not shown) may be comprehensively formed on the substrate 110 first. Next, the spacer wall material layer 172 may be formed through a patterning process as shown in FIG. 1G, which should however not be construed as limitations to the disclosure.

In some embodiments, a material of the spacer wall material layer 172 and a material of the spacer wall material layer 174 are different. For instance, the material of the spacer wall material layer 172 includes silicon oxide, the material of the spacer wall material layer 174 includes silicon nitride, and the spacer wall material layer 174 is formed through a deposition process, which should however not be construed as limitations to the disclosure.

Figure 1H:
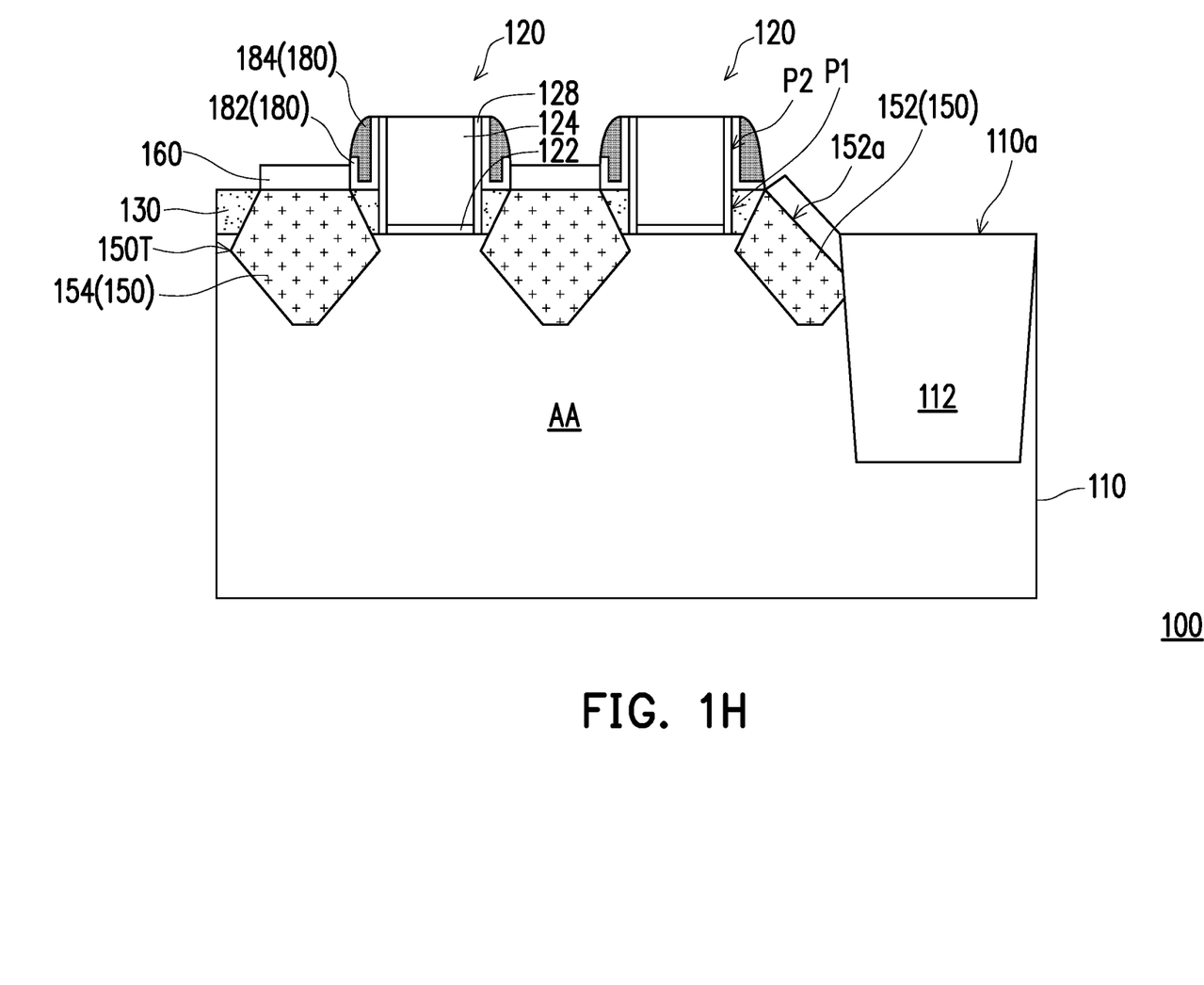

With reference to FIG. 1H, portions of the stacked structures 120 are removed to form gate structures 120, and a portion of the spacer wall material layer 170 is removed to form a spacer wall 180 (including spacer walls 182 and 184) on the epitaxial layer 130. Further, the gate structures 120 are arranged on the upper surface 110a. The S/D region 150 is arranged on two sides of each of the gate structures 120, is partially embedded in the substrate 110, and has the tip 150T located in the substrate 110. The material of the S/D region 150 includes silicon germanium. The epitaxial layer 130 is arranged between the gate structures 120 and the S/D region 150. Further, the spacer wall 180 is arranged on the epitaxial layer 130 on two sides of each of the gate structures 120.

Therefore, in this embodiment, the embedded silicon germanium having the tip 150T acts as the S/D region 150. Further, the epitaxial layer 130 is introduced between the upper surface 110a of the substrate 110 and the spacer wall 180, and through the introduction of the epitaxial layer 130, the overall height is increased when the S/D region 150 is manufactured. In such a design, the distance between the tip 150T of the S/D region 150 and the channel region may be effectively decreased, stress application performed by the S/D region 150 may be improved, hole mobility may be increased, and performance of the semiconductor device 100 may further be enhanced.

In some embodiments, removal of portions of the stacked structures 120 is removal of, for example the hard mask layer 126 and a portion of the insulating layer 128. Therefore, each of the gate structures 120 includes the gate dielectric layer 122, the conductor layer 124, and a remaining portion of the insulating layer 128 as shown in FIG. 1H, which should however not be construed as limitations to the disclosure.

In some embodiments, portions of the stacked structures 120 and a portion of the spacer wall material layer 170 are removed through the etching process, which should however not be construed as limitations to the disclosure.

In some embodiments, the gate dielectric layer 122 is located below the spacer wall 180, which should however not be construed as limitations to the disclosure.

In some embodiments, the spacer wall 180 directly contacts the epitaxial layer 130, which should however not be construed as limitations to the disclosure.

In some embodiments, the S/D region 150, the gate structures 120, and the spacer wall 180 surround the epitaxial layer 130, which should however not be construed as limitations to the disclosure.

In some embodiments, a first portion P1 of a side wall of each of the gate structures 120 is covered by the epitaxial layer 130, a second portion of the side wall of each of the gate structures 120 is covered by the spacer wall 180, and the first portion P1 is located between the upper surface 110a and the second portion P2, which should however not be construed as limitations to the disclosure.

In view of the foregoing, the embedded silicon germanium having the tip acts as the S/D region in the disclosure. Further, the epitaxial layer is introduced between the upper surface of the substrate and the spacer wall, and through the introduction of the epitaxial layer, the overall height is increased when the S/D region is manufactured. In such a design, the distance between the tip of the S/D region and the channel region may be effectively decreased, stress application performed by the S/D region may be improved, hole mobility may be increased, and performance of the semiconductor device may further be enhanced. Further, through arrangement of the epitaxial layer, the layer number of the sacrificial side wall material layer to be used may be decreased, the number of the etching process may be lowered, and manufacturing costs are thereby lowered. On the other hand, through arrangement of the epitaxial layer, the facet profile of on the S/D region may be changed, and therefore, contact resistance of a conductive member (e.g., a contact window) subsequently formed on the S/D region may be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor device, comprising:
   providing a substrate having a stacked structure;
   performing an epitaxy process to form an epitaxial layer on the substrate on two sides of the stacked structure;
   forming a recess on the two sides of the stacked structure, wherein the recess penetrates through the epitaxial layer, extends into the substrate, and has a tip located in the substrate;
   forming a source/drain region in the recess, wherein a material of the source/drain region comprises silicon germanium;
   forming a spacer wall material layer on the substrate;
   removing a portion of the stacked structure to from a gate structure; and
   removing a portion of the spacer wall material layer to form a spacer wall on the epitaxial layer.

2. The manufacturing method of the semiconductor device according to claim 1, wherein the stacked structure comprises a hard mask layer, and the step of forming the recess further comprises:
   forming a sacrificial side wall material layer on the epitaxial layer on the two sides of the stacked structure; and
   performing an etching process on the hard mask layer and the sacrificial side wall material layer to remove a portion of the epitaxial layer and a portion of the substrate.

3. The manufacturing method of the semiconductor device according to claim 2, wherein the sacrificial side wall material layer is a single-layered structure.

4. The manufacturing method of the semiconductor device according to claim 2, wherein an etchant of the etching process etches in a direction of the epitaxial layer and a crystal plane (111) of the substrate.

5. The manufacturing method of the semiconductor device according to claim 2, wherein a side wall of the recess is directly connected to a side wall of the sacrificial side wall material layer.

6. The manufacturing method of the semiconductor device according to claim 2, further comprising removing the sacrificial side wall material layer after forming the source/drain region and before forming the spacer wall material layer to expose the epitaxial layer.

7. The manufacturing method of the semiconductor device according to claim 1, wherein the substrate comprises an isolation structure, and the epitaxial layer is not formed on the isolation structure when the epitaxy process is performed.

8. The manufacturing method of the semiconductor device according to claim 7, wherein the isolation structure is exposed by the adjacent recess.

9. The manufacturing method of the semiconductor device according to claim 1, wherein the substrate is a silicon substrate to perform a selective silicon growth epitaxy process to form the epitaxial layer.

10. The manufacturing method of the semiconductor device according to claim 1, wherein a cross-sectional shape of the recess comprises a diamond shape.

* * * * *